(12) United States Patent
Konegawa

(10) Patent No.: US 11,579,386 B2
(45) Date of Patent: Feb. 14, 2023

(54) OPTICAL ELEMENT DEVICE AND PRODUCING METHOD THEREOF

(71) Applicant: NITTO DENKO CORPORATION, Osaka (JP)

(72) Inventor: Naoto Konegawa, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 17/262,412

(22) PCT Filed: Jul. 25, 2019

(86) PCT No.: PCT/JP2019/029208
§ 371 (c)(1),
(2) Date: Jan. 22, 2021

(87) PCT Pub. No.: WO2020/022427
PCT Pub. Date: Jan. 30, 2020

(65) Prior Publication Data
US 2021/0294050 A1 Sep. 23, 2021

(30) Foreign Application Priority Data
Jul. 25, 2018 (JP) .............................. JP2018-139759

(51) Int. Cl.
*G02B 6/42* (2006.01)
(52) U.S. Cl.
CPC .............. *G02B 6/4214* (2013.01); *G02B 6/42* (2013.01); *G02B 6/4228* (2013.01); *G02B 6/4244* (2013.01)
(58) Field of Classification Search
CPC .......... G02B 6/42; G02B 6/43; G02B 6/4214; G02B 6/4221; G02B 6/4228; G02B 6/4244
(Continued)

(56) References Cited

U.S. PATENT DOCUMENTS 9,971,111 B1 5/2018 Hsu
2008/0181561 A1* 7/2008 Furuyama ............ G02B 6/4221
385/52
(Continued)

FOREIGN PATENT DOCUMENTS

CN 101566706 A 10/2009
CN 103869411 A 6/2014
(Continued)

OTHER PUBLICATIONS

International Search Report Issued in PCT/JP2019/029208 dated Aug. 27, 2019.
(Continued)

*Primary Examiner* — Michael P Mooney
(74) *Attorney, Agent, or Firm* — Edwards Neils LLC; Jean C. Edwards, Esq.

(57) ABSTRACT

An optical element device includes an opto-electric hybrid board sequentially including an optical waveguide having a mirror, and an electric circuit board having a terminal in a thickness direction, and an optical element optically connected to the mirror and electrically connected to the terminal. The opto-electric hybrid board includes a mounting region including the mirror and the terminal when projected in the thickness direction and mounted with the optical element. Furthermore, the opto-electric hybrid board includes an alignment mark for aligning the optical element with respect to the mirror. The alignment mark is made of a material for forming the optical waveguide, and disposed at both outer sides of the mounting region in a width direction.

8 Claims, 6 Drawing Sheets

(58) Field of Classification Search
USPC .......................................................... 385/31
See application file for complete search history.

(56) References Cited

U.S. PATENT DOCUMENTS

| | | |
|---|---|---|
| 2009/0269704 A1 | 10/2009 | Hodono |
| 2010/0247030 A1 | 10/2010 | Furuyama |
| 2012/0219251 A1 | 8/2012 | Kuroda et al. |
| 2018/0196207 A1 | 7/2018 | Hsu |

FOREIGN PATENT DOCUMENTS

| | | |
|---|---|---|
| JP | 2005-321588 A | 11/2005 |
| JP | 2008-158440 A | 7/2008 |
| JP | 2010-232319 A | 10/2010 |
| JP | 2013-257433 A | 12/2013 |
| JP | 2014-173848 A | 9/2014 |
| JP | 2015-072497 A | 4/2015 |
| JP | 2015-114390 A | 6/2015 |
| WO | 2013/105470 A1 | 7/2013 |

OTHER PUBLICATIONS

Written Opinion Issued in PCT/JP2019/029208 dated Aug. 27, 2019.
International Preliminary Report on Patentability issued by WIPO dated Jan. 26, 2021, in connection with International Patent Application No. PCT/JP2019/029208.
Office Action, issued by the Japanese Patent Office dated Apr. 19, 2022, in connection with Japanese Patent Application No. 2018-139759.
Office Action, issued by the Japanese Patent Office dated Sep. 6, 2022, in connection with Japanese Patent Application No. 2018-139759.
Office Action, issued by the State Intellectual Property Office dated Sep. 14, 2022, in connection with Chinese Patent Application No. 201980048769.1.

* cited by examiner

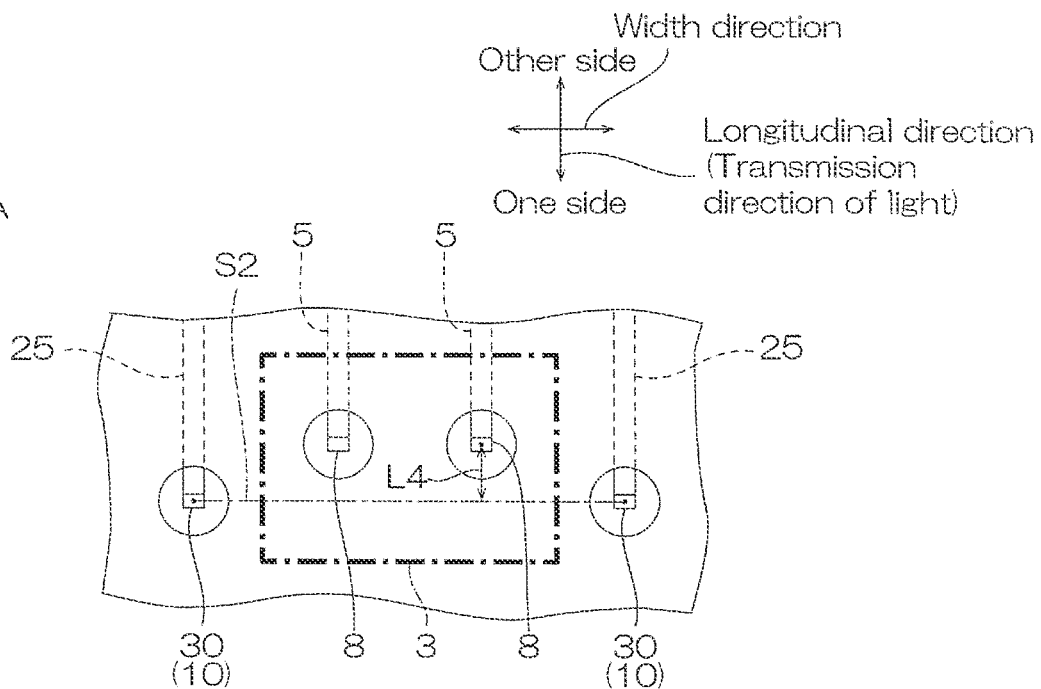
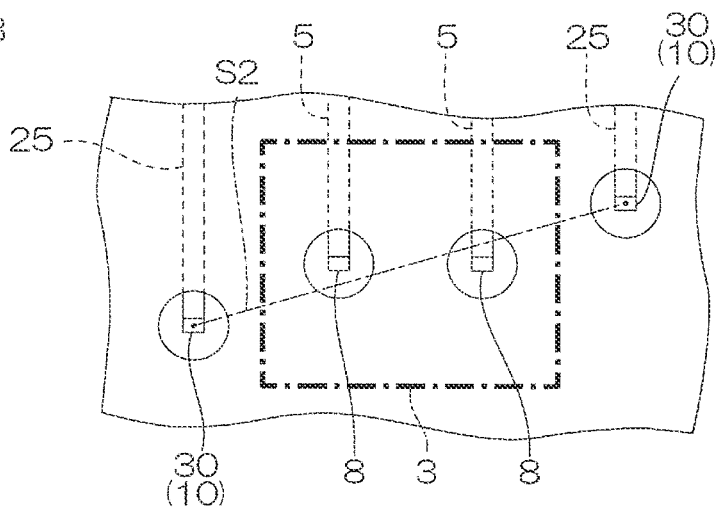
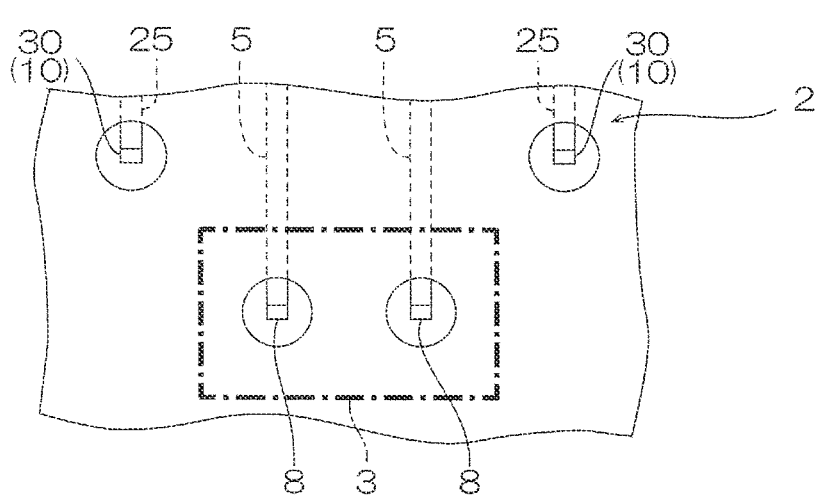

OPTICAL ELEMENT DEVICE AND PRODUCING METHOD THEREOF

CROSS-REFERENCE TO RELATED APPLICATIONS

The present application is a 35 U.S.C. 371 National Stage Entry of PCT/JP2019/029208, filed on Jul. 25, 2019, which claims priority from Japanese Patent Application No. 2018-139759, filed on Jul. 25, 2018, the contents of all of which are herein incorporated by reference in their entirety.

The present invention relates to an optical element device and a producing method thereof, to be specific, to an optical element device and a method for producing an optical element device.

BACKGROUND ART

Conventionally, an optical waveguide device which includes a long opto-electric hybrid board including an optical waveguide having an optical path conversion mirror and a wiring board disposed thereon, and a light receiving element mounted on the opto-electric hybrid board has been known.

For example, an optical waveguide device including an alignment groove disposed at one side in a width direction of the light receiving element has been proposed (ref: for example, Patent Document 1).

In Patent Document 1, the alignment groove has the same shape as the optical path conversion mirror, and the alignment groove is used for positioning of a photomask when another core layer is fabricated b photolithography.

CITATION LIST

Patent Document

Patent Document 1. Japanese Unexamined Patent Publication No. 2015-72497

SUMMARY OF THE INVENTION

Problem to be Solved by the Invention

However, when the light receiving element is mounted on the opto-electric hybrid board, it is tentatively considered that a light receiving portion of the light receiving element is aligned (positioned) with respect to the optical path conversion mirror based on an alignment mark. Specifically, in the optical waveguide device of Patent Document 1, it is tentatively considered that the alignment described above is carried out based on the alignment groove.

However, the opto-electric hybrid board easily shrinks in the width direction due to the heating during the production steps, and in this case, since a distance between the alignment groove and the optical path conversion mirror greatly varies, the accuracy of the alignment is reduced based on this.

The present invention provides an optical element device in which a reduction in the positional accuracy of an optical element with respect to a mirror is suppressed, and a method for producing an optical element device.

Means for Solving the Problem

The present invention (1) includes an optical element device including an opto-electric hybrid board sequentially including an optical waveguide having a mirror, and an electric circuit board having a terminal in a thickness direction, and an optical element optically connected to the mirror and electrically connected to the terminal, wherein the opto-electric hybrid board includes a mounting region including the mirror and the terminal when projected in the thickness direction and mounted with the optical element, and further includes an alignment mark for aligning the optical element with respect to the mirror, made of a material for forming the optical waveguide, and disposed at both outer sides of the mounting region in a width direction perpendicular to a transmission direction of light of the optical waveguide and the thickness direction.

In the optical element device, since the alignment mark is disposed at both outer sides of the mounting region in the width direction including the mirror when projected in the thickness direction, even when a length in the width direction between the alignment mark and the mirror at one side in the width direction varies, a distance between the alignment marks at both outer sides in the width direction before and after the variation is determined. Based on this, it is possible to calculate an amount of shrinkage (or shrinkage ratio), and the alignment based on the alignment mark in consideration of such an amount of shrinkage is carried out. Therefore, a reduction in alignment accuracy of the optical element with respect to the mirror is suppressed. As a result, the optical element device is excellent in optical connection reliability.

The present invention (2) includes the optical element device described in (1), wherein the alignment mark is overlapped with the mirror or is close to the mirror when projected in the width direction.

In the optical element device, a reduction in the alignment accuracy of the optical element with respect to the mirror is further suppressed.

The present invention (3) includes the optical element device described in (1) or (2), wherein a length L1 of a first line segment connecting the respective centers of the mirror and the alignment mark closest to the mirror is 10 μm or more, and a length L2 of a second line segment connecting the respective centers of the two alignment marks is 30 μm or more.

In the optical element device, the alignment mark can be sufficiently separated from the mounting region. Therefore, it is possible to prevent the alignment mark from being overlapped with the optical element in the thickness direction, and thus, it is possible to suppress a reduction in the alignment accuracy.

The present invention (4) includes the optical element dev ice described in any one of (1) to (3), wherein the alignment mark is directly visible from the thickness direction.

In the optical element device, since the alignment mark is directly visible from the thickness direction, it is possible to suppress a reduction in the alignment accuracy.

The present invention (5) includes the optical element device described in any one of (1) to (4), wherein the plurality of mirrors are disposed at spaced intervals in the width direction.

However, when the plurality of mirrors are disposed at spaced intervals in the width direction, the positional accuracy of the mirror with the optical element is easily reduced greatly at the time of shrinkage of the opto-electric hybrid board in the width direction.

However, in the optical element device, since the alignment mark is disposed at both outer sides of the mounting region in the width direction, by considering the deviation of the plurality of mirrors due to the shrinkage in the width direction described above, it is possible to suppress a reduction in the alignment accuracy of the optical element with respect to the mirror.

The present invention (6) includes the optical element device described in any one of (1) to (5), wherein the alignment mark includes a dummy mirror.

In the optical element device, when light whose optical path is converted from the dummy mirror is detected, it is possible to easily align the optical element in the mirror based on the light.

The present invention (7) includes the optical element device described in any one of (1) to (6), wherein the alignment mark includes a dummy core.

In the optical element device, when the dummy core is detected, it is possible to easily align the optical element in the mirror based on the detection.

The present invention (8) includes a method for producing an optical element device including a first step of preparing an opto-eclectic hybrid board sequentially including an optical waveguide having a mirror and an electric circuit board having a terminal in a thickness direction, including a mounting region including the terminal and the mirror when projected in the thickness direction, and furthermore, including an alignment mark made of a material for forming the optical waveguide and disposed at both outer sides of the mounting region in a width direction perpendicular to a transmission direction of light of the optical waveguide and the thickness direction, and a second step of aligning an optical element with respect to the mirror based on the alignment mark to be optically connected to the mirror and to be electrically connected to the terminal, and mounting the optical element on the opto-electric hybrid board, wherein in the second step, the optical element is mounted in the mounting region so as not to be overlapped with the alignment mark when projected in the thickness direction.

In the method for producing an optical element device, in the second step, since the optical element is mounted in the mounting region so as not to be overlapped with the alignment mark when projected in the thickness direction, it is possible to reliably align the optical element with respect to the mirror, while the alignment mark is visually recognized in the thickness direction.

Effect of the Invention

The optical element device of the present invention is excellent in optical connection reliability.

In the method for producing an optical element device of the present invention, it is possible to reliably align an optical element with respect to a mirror.

BRIEF DESCRIPTION OF THE DRAWINGS

FIG. 2A illustrating a cross-sectional view of an A-A view of FIG. 1 and FIG. 2B illustrating a cross-sectional view of a B-B view of FIG. 1.

FIGS. 4A to 4C show enlarged plan views of a modified example (embodiment of not being overlapped with a mirror) of an alignment mark of the optical element device shown in FIG. 1:

FIG. 4A illustrating an embodiment in which the two alignment marks deviate toward one side in a longitudinal direction with respect to the mirror.

FIG. 4B illustrating an embodiment in which the two alignment marks deviate toward one side and the other side in the longitudinal direction with respect to the mirror, and FIG. 4C illustrating an embodiment in which the alignment marks are separated from the mirror.

FIG. 6A illustrating an enlarged plan view and

FIG. 6B illustrating a cross-sectional view of a D-D view of FIG. 6A.

DESCRIPTION OF EMBODIMENTS

One embodiment of an optical element device of the present invention is described with reference to FIGS. 1 to 3.

Figure 1:
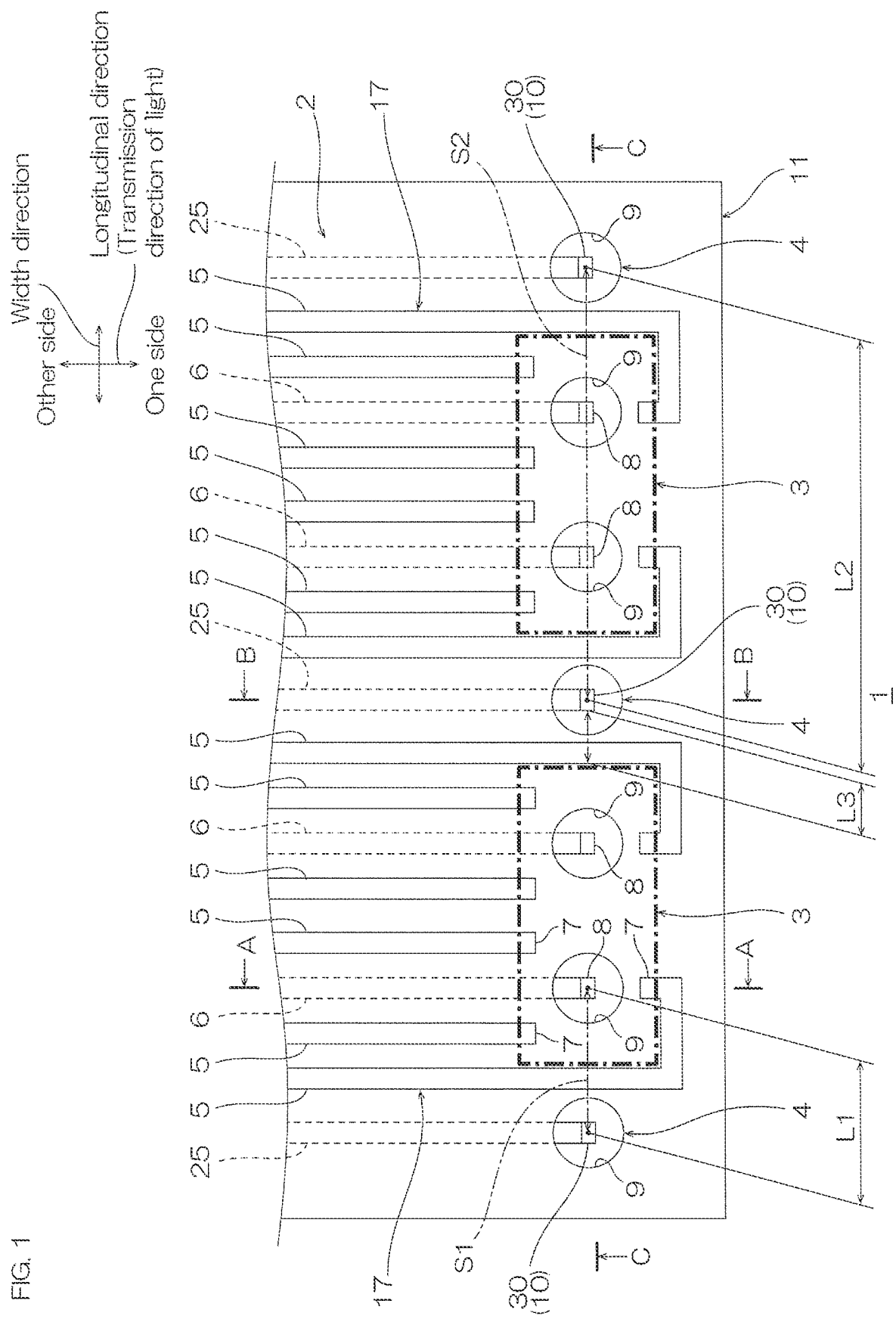
FIG. 1 shows a plan view of one embodiment of an optical element device of the present invention.

In FIG. 1, a base insulating layer 16 (described later) is omitted in order to clearly show the arrangement and shape of a core 6 (described later) and a dummy core 25 (described later).

Figure 2A:
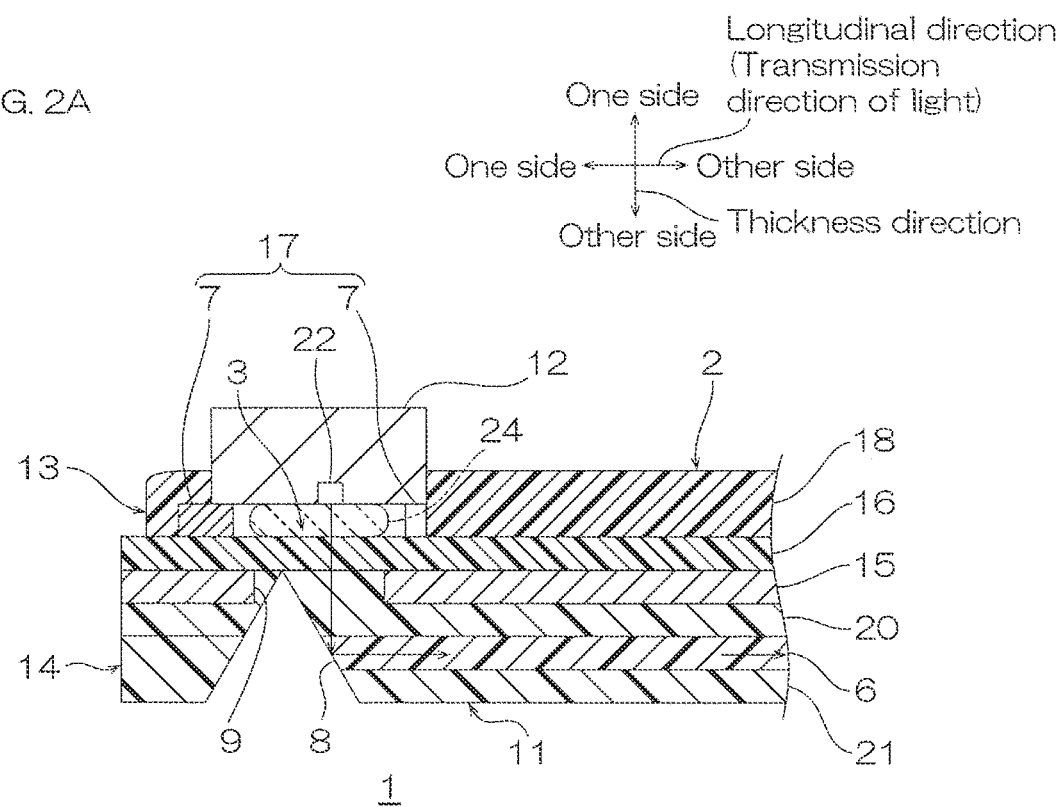
FIGS. 2A to 2B show side cross-sectional views of an alignment mark of the optical element device shown in FIG. 1.
Figure 2B:
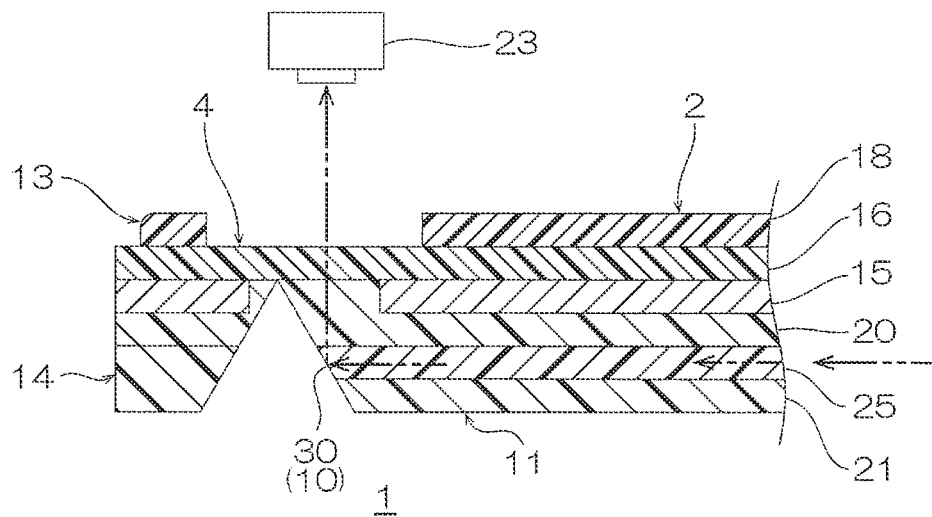
Figure 3:
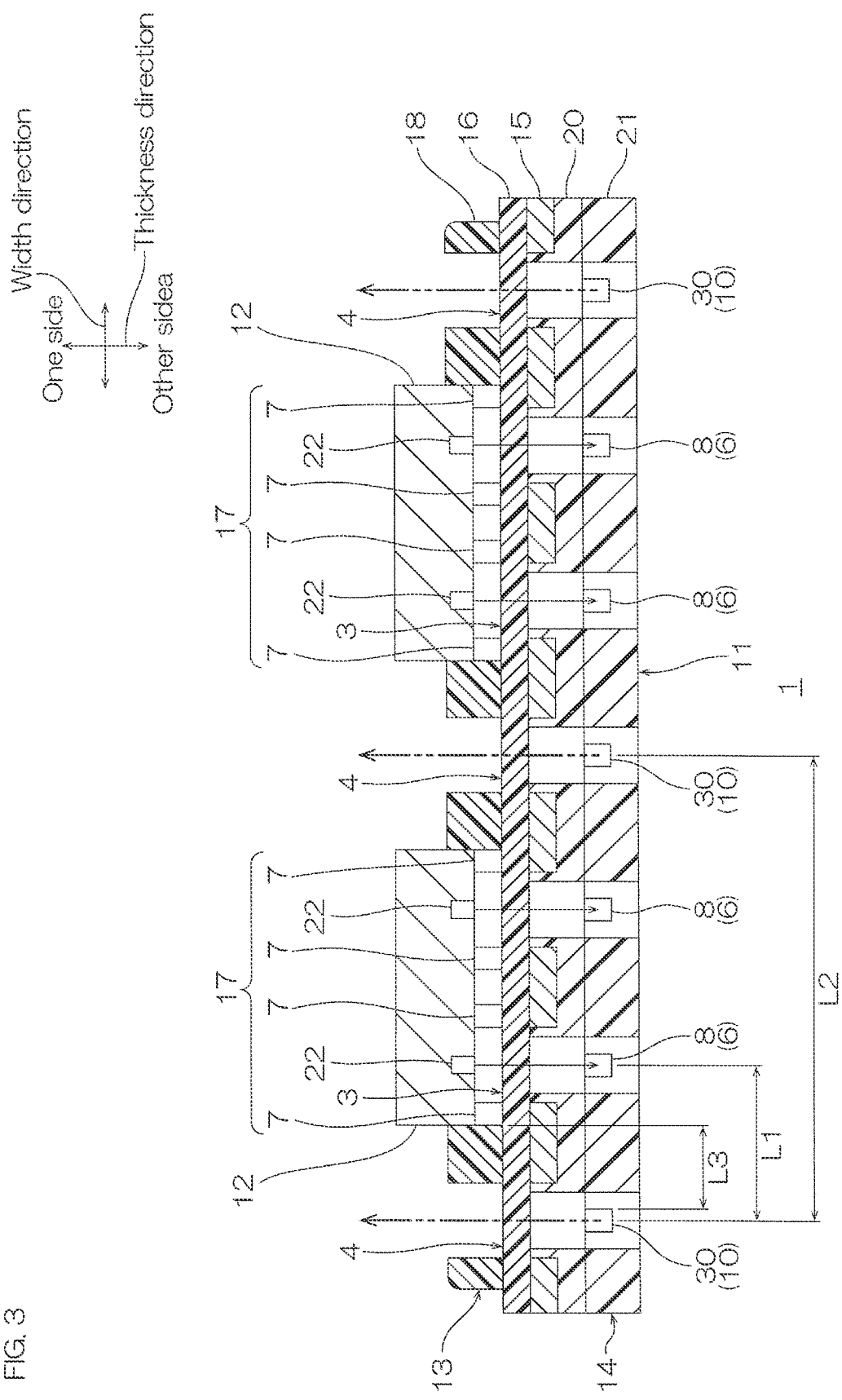
FIG. 3 shows a front cross-sectional view of a C-C view of an alignment mark of the optical element device shown in FIG. 1.

As shown in FIGS. 2A to 3, an optical element device 1 includes an opto-electric hybrid board 11 and an optical element 12 mounted on the opto-eclectic hybrid board 11.

The opto-electric hybrid board 11 is a board for transmitting light output (irradiated) from the optical element 12 and electricity input into the optical element 12. As shown in FIG. 1, the opto-electric hybrid board 11 has a generally rectangular sheet shape extending in a longitudinal direction (up-down direction in FIG. 1) as one example of a direction in which the light and the electricity are transmitted. In other words, the opto-electric hybrid board 11 is long in the longitudinal direction, and is short in a width direction (direction perpendicular to the longitudinal direction and a thickness direction) A ratio of a length in the longitudinal direction of the opto-electric hybrid board 11 to a length in the width direction is, for example, 2 or more, preferably 10 or more, more preferably 100 or more, and for example, 10,000 or less.

As shown in FIGS. 2A to 3, the opto-electric hybrid board 11 includes one surface and the other surface facing each other in the thickness direction.

As shown in FIG. 1, the opto-electric hybrid board 11 includes a transmission region 2, a mounting region 3, and a mark region 4.

The transmission region 2 is a region for transmitting both the light and the electricity along the longitudinal direction. The transmission region 2 is located in the middle portion in the longitudinal direction of the opto-electric hybrid board 11. In the transmission region 2, a wiring 5 to be described later, the core 6, and the dummy core 25 are formed along the longitudinal direction.

The mounting region 3 is a region in which the optical element 12 (ref: FIGS. 2A to 3) is mounted. The mounting region 3 is disposed at each of one side and the other side (not shown) in the longitudinal direction of the transmission region 2. Specifically, the mounting region 3 is located at each of one end portion and the other end portion (not shown) in the longitudinal direction in the opto-electric hybrid board 11. Furthermore, the plurality of (two) mounting regions 3 are disposed at spaced intervals in the width direction in each of one end portion and the other end portion (not shown) in the longitudinal direction of the opto-electric hybrid board 11.

Each mounting region 3 is a region having a generally rectangular shape when viewed from the top corresponding to the optical element 12. The mounting region 3 includes a terminal 7 and a mirror 8 when projected in the thickness direction.

The terminal 7 is disposed in the mounting region 3. The plurality of terminals 7 are disposed at spaced intervals to each other in a circumferential direction in an inner peripheral end portion of the mounting region 3. Specifically, the terminals 7 are provided in two opposite end portions facing each other in the longitudinal direction in the inner peripheral end portion of the mounting region 3.

The mirror 8 is disposed in the mounting region 3. The plurality of (two) mirrors 8 are disposed at spaced internals to each other in the width direction in the central portion in the longitudinal direction of the mounting region 3. The plurality of (two) mirrors 8 are overlapped (coincide) when projected in the width direction. Each of the mirrors 8 has a generally rectangular shape when viewed from the top.

The mark region 4 is a region in which an alignment mark 30 to be described later is formed. The mark region 4 is disposed at both outer sides of the mounting region 3 in the width direction. Specifically, the mark region 4 is disposed at one side and the other side (not shown) in the longitudinal direction of the transmission region 2, and is located in one end portion and the other end portion in the longitudinal direction in the opto-electric hybrid board 11. The plurality of (three) mark regions 4 are disposed at spaced intervals in the width direction in each of one end portion and the other end portion in the longitudinal direction of the opto-electric hybrid board 11. Specifically, in each of one end portion and the other end portion in the longitudinal direction of the opto-electric hybrid board 11, the mark region 4 and the mounting region 3 are disposed in this order from the outside toward the inside in the width direction. For example, the mark region 4 and the mounting region 3 are alternately disposed from one side toward the other side in the width direction, and the mark region 4 is disposed in the other end portion in the width direction. The mark region 4 is also disposed between the two mounting regions 3.

The details of a layer configuration and materials of the opto-electric hybrid board 11 are described later.

As shown in FIGS. 2A to 3, the optical element 12 is mounted on one surface in the thickness direction of the opto-electric hybrid board 11, and specifically, mounted in the mounting region 3. The optical element 12 has a generally box shape, and has an electrode which is not shown and an irradiation port 22 on the other surface in the thickness direction thereof.

The electrode (not show n) is electrically connected to the terminal 7, and specifically, is in contact with one surface in the thickness direction of the terminal 7. That is, the optical element 12 is electrically connected to the terminal 7.

The irradiation port 22 is optically connected to the mirror 8. The irradiation port 22 is disposed so as to be overlapped with the mirror 8 when projected in the thickness direction. That is, the optical element 12 is optically connected to the mirror 8. However, the irradiation port 22 is spaced apart from the mirror 8 in the thickness direction.

Further, the optical element 12 is mounted in the mounting region 3 so that its peripheral end portion is overlapped (coincides) with die inner peripheral end portion of die mounting region 3 when viewed from the top.

Specific examples of the optical element 12 include light emitting elements such as a VCSEL (vertical cavity surface emitting laser) light source.

The opto-electric hybrid board 11 includes an electric circuit board 13 and an optical waveguide 14 in order toward the other side in the thickness direction.

The electric circuit board 13 has the same outer shape as the opto-electric hybrid board 11. The electric circuit board 13 includes a metal support layer 15, the base insulating layer 16, a conductive layer 17, and a cover insulating layer 18 in order toward one side in the thickness direction.

The metal support layer 15 is continuously formed over the transmission region 2, the mounting region 3, and the mark region 4. The metal support layer 15 has an opening portion 9 in the mounting region 3 and the mark region 4. The opening portion 9 is a through hole penetrating in the thickness direction, and has a generally circular shape when viewed from the bottom. The plurality of opening portions 9 are provided corresponding to the mirrors 8 and the alignment marks 30 (described later). Specifically, the opening portions 9 are formed so as to surround each of the plurality of mirrors 8 when viewed from the bottom.

Examples of a material for the metal support layer 15 include metals such as stainless steel.

The base insulating layer 16 is continuously formed over the transmission region 2, the mounting region 3, and the mark region 4. The base insulating layer 16 is disposed on one surface in the thickness direction of the metal support layer 1S. The base insulating layer 16 closes one end edge in the thickness direction of the opening portion 9. Thus, the base insulating layer 16 forms one surface in the thickness direction which is a mounting surface of the mounting region 3 and the mark region 4. Examples of a material for the base insulating layer 16 include resins having transparency, and a preferable example thereof includes polyimide.

The conductive layer 17 is continuously formed over the transmission region 2 and the mounting region 3. The conductive layer 17 is disposed on one surface in the thickness direction of the base insulating layer 16. The conductive laser 17 has the terminal 7 and the wiring 5.

The terminal 7 is included in the mounting region 3 so as to have the above-described arrangement.

The wiring 5 is formed in the transmission region 2, and is continuous to the terminal 7. The wiring 5 has one end continuous to the terminal 7, and the other end continuous to another terminal which is not shown. The plurality of wirings 5 are disposed to be adjacent to each other at spaced intervals in the width direction. Each of the plurality of wirings 5 has a generally linear shape extending in the longitudinal direction.

Examples of a material for the conductive layer 17 include conductors such as copper.

The cover insulating layer 18 is disposed in the transmission region 2, and is disposed on one surface in the thickness direction of the base insulating layer 16 so as to cover a portion of the conductive layer 17. Specifically, the cover insulating layer 18 exposes the terminal 7, while covering the wiring 5.

The cover insulating layer 18 exposes one surface in the thickness direction of the base insulating layer 16 in the mounting region 3 and the mark region 4. That is, the cover insulating layer 18 is formed in the transmission region 2, and the cover insulating laser 18 is not formed in the mounting region 3 and the mark region 4.

A material for the cover insulating layer 18 is the same as the material for the base insulating layer 16.

A thickness of the electric circuit board 13 is, for example, 20 μm or more, and for example, 200 μm or less.

The optical waveguide 14 is disposed on the other surface in the thickness direction of the electric circuit board 13. As shown in FIGS. 1 to 2B, the optical waveguide 14 has a generally sheet shape extending in the longitudinal direction. As shown in FIG. 3, the optical waveguide 14 includes an under clad 20, the core 6 (ref: FIGS. 1 and 2A), the dummy core 25 (ref: FIGS. 1 and 2B), and an over clad 21 in order toward the other side in the thickness direction.

As shown in FIGS. 2A to 3, the under clad 20 is continuously formed in the transmission region 2, the mounting region 3, and the mark region 4, and is disposed on the other surface in the thickness direction of the electric circuit board 13.

As shown in FIGS. 1 to 2A, the core 6 is formed in the transmission region 2 and the mounting region 3, and is disposed on the other surface in the thickness direction of the under clad 20. Further, the plurality of cores 6 are disposed at spaced intervals to each other in the width direction. As referred to a reference numeral 8 (mirror) of FIG. 3, each of the plurality of cores 6 has, for example, a generally rectangular shape when viewed in the cross-sectional view. The core 6 is provided corresponding to the mirror 8, and specifically, has the mirror 8 on one end surface in the longitudinal direction in the mounting region 3. The mirror 8 is an inclined surface forming an angle of 45 degrees with respect to the other surface in the thickness direction of the under clad 20. Thus, the mirror 8 is an optical path conversion member which is capable of converting an optical path along the thickness direction and the optical path along the longitudinal direction to each other.

As shown in FIGS. 1 and 2B, the dummy core 25 is continuously formed in the transmission region 2 and the mark region 4, and is provided in parallel with the core 6 on the other surface in die thickness direction of die under clad 20. The dummy core 25 is spaced apart from the core 6 in the width direction. Further, the dummy core 25 is provided corresponding to the alignment mark 30, and has the alignment mark 30 on one end surface in the longitudinal direction in the mark region 4. The alignment mark 30 is a dummy mirror 10, and the shape thereof is the same as the mirror 8 described above. The dummy mirror 10 is the optical path conversion member in the same manner as the mirror 8. In the dummy mirror 10, an object to be converted is not transmission signal light, and is inspection light (detection light) used in the alignment of the optical element 12 to be recognized with a camera 23 to be described later. Therefore, the alignment mark 30 is provided to align the optical element 12 with respect to the mirror 8.

Since the alignment mark 30 is formed in the mark region 4 in the arrangement described above, it is disposed at both outer sides of the mounting region 3 in the width direction. Specifically, the alignment mark 30 is overlapped (coincides) with the mirror 8 when projected in the width direction.

The over clad 21 is continuously formed in the transmission region 2, the mounting region 3, and the mark region 4, and is disposed on the other surface in the thickness direction of the under clad 20 so as to cover the core 6 and the dummy core 25. On the other hand, the over clad 21 exposes the mirror 8 and the alignment mark 30 (the dummy mirror 10).

Examples of a material for the under clad 20, the core 6, the dummy core 25, and the over clad 21 (material for forming the optical waveguide 14) (optical waveguide material) include transparent resins such as an epoxy resin and an acrylic resin. The refractive index of the core 6 and the dummy core 25 is high with respect to that of the under clad 20 and over clad 21. The refractive index of the dummy core 25 may be higher than that of the under clad 20 and the over clad 21. For example, the refractive index of the dummy core 25 may be different from or may be the same as that of the core 6, and preferably, is the same as that of the core 6.

A width (length in the width direction) of the core 6 is, for example, 20 μm or more, and for example, 100 μm or less. An interval between the cores 6 adjacent to each other is, for example, 20 μm or more, and for example, 1,000 μm or less.

A width of the dummy core 25 is the same as the width of the core 6 described above.

A width of the mirror 8 may be the same as or different from the width of the core 6, and preferably, is the same.

A width of the dummy mirror 10 (the alignment mark 30) is the same as the width of the mirror 8.

A length L1 of a first line segment S1 connecting the respective centers of the mirror 8 and the alignment mark 30 closest to the mirror 8 is, for example, 10 sim or more, preferably 15 μm or more, more preferably 20 μm or more, and for example, 100 μm or less.

A length L2 of a second line segment S2 connecting the respective centers of the two alignment marks 30 disposed at both outer sides of the mounting region 3 is, for example, 30 μm or more, preferably 100 μm or more, and for example, 10 mm or less.

When the length L1 of the first line segment S1 and the length L2 of the second line segment S2 are the above-described lower limit or more, it is possible to avoid the optical element 12 to be overlapped with the alignment mark 30 when projected in the thickness direction at the time of mounting the optical element 12 in the corresponding mounting region 3. Therefore, it is possible to accurately carry out the alignment of the optical element 12 based on the alignment mark 30.

The shortest distance L3 between the outer end edge of the mounting region 3 when viewed from the top (specifically, the outer end edge of the optical element 12) and the mirror 8 is, for example, 1 μm or more, preferably 5 μm or more, more preferably 10 μm or more, and for example, 5,000 μm or less.

A thickness of the optical waveguide 14 is, for example, 20 μm or more, and for example, 200 μm or less.

Next, a method for producing the optical element device 1 is described.

First, the opto-electric hybrid board 11 is prepared (first step).

In the first step, first, for example, the flat plate-shaped metal support layer 15 is prepared, and the base insulating layer 16, the conductive later 17, and the cover insulating layer 18 are formed in order at one side in the thickness direction thereof. Thereafter, the opening portion 9 is formed in the metal support layer 15 to produce the electric circuit board 13. Subsequently, the under clad 20, the core 6, the dummy core 25, and the over clad 21 are formed in order on the other surface in the thickness direction of the electric circuit board 13. The core 6 and the dummy core 25 can be formed at the same time or at different times, and are preferably formed from the same material at the same time. Further, in the formation of each layer, if necessary, heat treatment is carried out. Thereafter, by cutting out one end portions in the longitudinal direction of the core 6 and the dummy core 25, the mirror 8 and the alignment mark 30 are formed. Preferably, the mirror 8 and the alignment mark 30 are cut out at the same time with a laser or the like.

Thereafter, the optical element 12 is mounted on the opto-electric hybrid board 11 based on the alignment mark 30 (second step).

In the second step, as shown by thick phantom lines of FIGS. 2B and 3, specifically, the inspection light is input from the other end portion in the longitudinal direction of the dummy core 25, and subsequently, the inspection light is radiated from the alignment mark 30 toward one side in the thickness direction. Then, as shown in FIGS. 2A and 3, the irradiation port 22 of the optical element 12 is oppositely disposed at one side in the thickness direction of the mirror 8, while the inspection light is recognized with the camera 23 disposed at one side in the thickness direction of the opto-electric hybrid board 11. Thus, the optical element 12 is optically connected to the core 6.

At the same time, an electrode (not shown) of the optical element 12 is brought into contact with die terminal 7 to electrically connect die optical element 12 to the conductive layer 17.

When the heat treatment is carried out in the first step, the length in die width direction of the opto-electric hybrid board 11, among all, the optical waveguide 14 easily varies greatly due to the heating shrinkage of the optical waveguide material.

However, in one embodiment, a distance between the alignment marks 30 disposed at both outer sides of the mounting region 3 in the width direction, specifically, the length L2 of the second line segment S2 before and after shrinkage is obtained. Based on this, it is possible to calculate an amount of shrinkage (or shrinkage ratio), and the alignment in consideration of the amount of shrinkage is carried out.

Thus, the optical element 12 is mounted in the mounting region 3 of the opto-electric hybrid board 11.

At this time, if necessary, as shown by a phantom line of FIG. 2A, by filling the mounting region 3 with a transparent adhesive 24, the optical element 12 is fixed to the mounting region 3. When the adhesive 24 is provided in the mounting region 3, the adhesive 24 is interposed between the irradiation port 22 and the mirror 8. In other words, the light irradiated from the irradiation port 22 passes through the adhesive 24 to then reach the mirror 8.

On the other hand, as shown in FIG. 2B, the adhesive 24 is not provided in the mark region 4. Therefore, the alignment mark 30 is directly visible from one side in the thickness direction without the adhesive 24.

In the second step, the optical element 12 is mounted in the mounting region 3 so as not to be overlapped with the alignment mark 30 when projected in the thickness direction.

Thus, the optical element device 1 including the opto-electric hybrid board 11 and the optical element 12 is produced.

In the optical element device 1, the electricity flows from the terminal 7 of the conductive layer 17 to the optical element 12, and thus, the optical element 12 emits light (is driven). Specifically, the light is irradiated from the irradiation port 22 of the optical element 12 toward the mirror 8, and such light is transmitted toward the other side in the longitudinal direction through the core 6.

The light is not input (not received) from the optical element 12 into the dummy core 25. Separately, the inspection device (not shown) is disposed at one side in the thickness direction of the alignment mark 30 (the dummy mirror 10), and it is also possible to carry out the optical inspection of the dummy core 25 having the same configuration as the core 6. Specifically, since the dummy core 25 and the core 6 have the same configuration, by carrying out the optical inspection of the dummy core 25, it is deemed that the optical inspection of the core 6 is carried out. Specifically, the optical quality of the dummy core 25 is determined, and thus, die optical quality of the core 6 is determined without actually carrying out the optical inspection of the core 6.

Then, in the optical element device 1, since the alignment mark 30 is disposed at both outer sides of the mounting region 3 in the width direction including die mirror 8 when projected in the thickness direction, even when the length in the width direction between the alignment mark 30 and the mirror 8 at one side in the width direction (specifically, the length L1 of the first line segment S1) varies by shrinkage, die distance between die alignment marks 30 at both outer sides in the width direction before and after the variation (shrinkage), specifically, the length L2 of the second line segment S2 is determined. Based on this, it is possible to calculate an amount of shrinkage (or shrinkage ratio) in the width direction, and the alignment based on the alignment mark 30 in consideration of such an amount of shrinkage is carried out. Therefore, a reduction in alignment accuracy of the optical element 12 with respect to the mirror 8 is suppressed. As a result, the optical element device 1 is excellent in optical connection reliability.

Further, in the optical element device 1, since the alignment mark 30 is overlapped (coincides) with the mirror 8 when projected in the width direction, a reduction in the alignment accuracy of the optical element 12 with respect to the mirror 8 is further suppressed.

Further, in the optical element device 1, when the length L1 of the first line segment S1 connecting the respective centers of die mirror 8 and die alignment mark 30 closest to the mirror 8 is 10 μm or more, and the length L2 of the second line segment S2 connecting the respective centers of the two dummy mirrors 10 disposed at both outer sides of the mounting region 3 is 30 μm or more, the alignment mark 30 can be sufficiently separated from the mounting region 3. Therefore, it is possible to prevent the alignment mark 30 from being overlapped with the optical element 12, and as a result, it is possible to suppress a reduction in the alignment accuracy.

Furthermore, since it is possible to avoid the alignment mark 30 to be overlapped with the optical element 12 when projected in the thickness direction, it is possible to reliably carry out the optical inspection of the dummy core 25 using the dummy mirror 10.

Further, in the optical element device 1, since the alignment mark 30 is directly visible from one side in the thickness direction without the adhesive 24 (dashed line hatching of FIG. 2A), the alignment accuracy based on the alignment mark 30 is high, that is, the alignment accuracy of the optical element 12 with respect to the mirror 8 is excellent.

However, when the plurality of mirrors 8 are disposed at spaced intervals in the width direction, the positional accuracy of the mirror 8 with the optical element 12 is easily reduced greatly at the time of shrinkage of the opto-electric hybrid board 11 in the width direction.

However, in the optical element device 1, since the alignment mark 30 is disposed at both outer sides of the mounting region 3 in the width direction, by considering the deviation of the plurality of mirrors 8 due to the shrinkage in the width direction described above, it is possible to suppress a reduction in the alignment accuracy of the optical element 12 with respect to the mirror 8.

Further, in the optical element device 1, since the mark region 4 is not filled with the adhesive 24, the alignment mark 30 is directly visible from the thickness direction, and therefore, it is possible to suppress a reduction in the alignment accuracy due to the presence of the adhesive 24.

Further, in the optical element device 1, since the light whose optical path is converted from the dummy mirror 10 is detected, it is possible to easily align the optical element 12 in the mirror 8 based on the light.

In the method for producing the optical element device 1, in the second step, since the optical element 12 is mounted in the mounting region 3 so as not to be overlapped with the alignment mark 30 when projected in the thickness direction, it is possible to reliably align the optical element 12 with respect to the mirror 8, while the alignment mark 30 is visually recognized in the thickness direction.

Furthermore, in the second step, since the optical element 12 is mounted in the mounting region 3 so as not to be overlapped with the alignment mark 30 when projected in the thickness direction, it is possible to reliably carry out the optical inspection of the dummy core 25 using the dummy mirror 10.

Modified Examples

Next, modified examples of one embodiment are described. In the following modified examples, the same reference numerals are provided for members and steps corresponding to each of those in the above-described one embodiment, and their detailed description is omitted. The modified examples can be appropriately used in combination. Furthermore, the modified examples can achieve the same function and effect as that of one embodiment unless otherwise specified.

In one embodiment, as shown in FIG. 1, the alignment mark 30 is overlapped with the mirror 8 when projected in the width direction. Alternatively, for example, as shown in FIGS. 4A to 4B, the alignment mark 30 may be also close to the mirror 8 without being overlapped with the mirror 8.

In the modified examples shown in FIGS. 4A to 4B, when the alignment mark 30 is included in the mounting region 3 when projected in the width direction, it is close to the mirror 8.

In the modified example of FIG. 4A, the alignment mark 30 deviates toward one side in the longitudinal direction with respect to the mirror 8 when projected in the width direction. An amount of deviation L4 in the longitudinal direction between the alignment mark 30 and the mirror 8 is allowed to be within a range of, for example, 10 mm or less, preferably 1 μm or less, more preferably 100 μm or less, and for example, 10 μm or more.

Although not shown, the alignment mark 30 may deviate toward the other side in the longitudinal direction with respect to the mirror 8 when projected in the width direction.

In the modified example of FIG. 4B, each of the two alignment marks 30 deviates toward each of one side and the other side in the longitudinal direction with respect to the mirror 8 when projected in the width direction. The second line segment S2 connecting the respective centers of the two alignment marks 30 passes through the mirrors 8 adjacent to each other.

On the other hand, as shown in FIG. 4C, the alignment mark 30 is not overlapped with the mirror 8, and furthermore, separated from the mirror 8 rather than being close thereto when projected in the width direction. In this case, the alignment mark 30 is, for example, located in the transmission region 2. Specifically, the alignment mark 30 is separated from the mirror 8 so as to exceed the amount of deviation L4 described above.

Of FIGS. 1 and 4A to 4C, preferably, examples of FIGS. 1 and 4A to 4B are used, more preferably, one embodiment shown in FIG. 1 is used.

Figure 5:
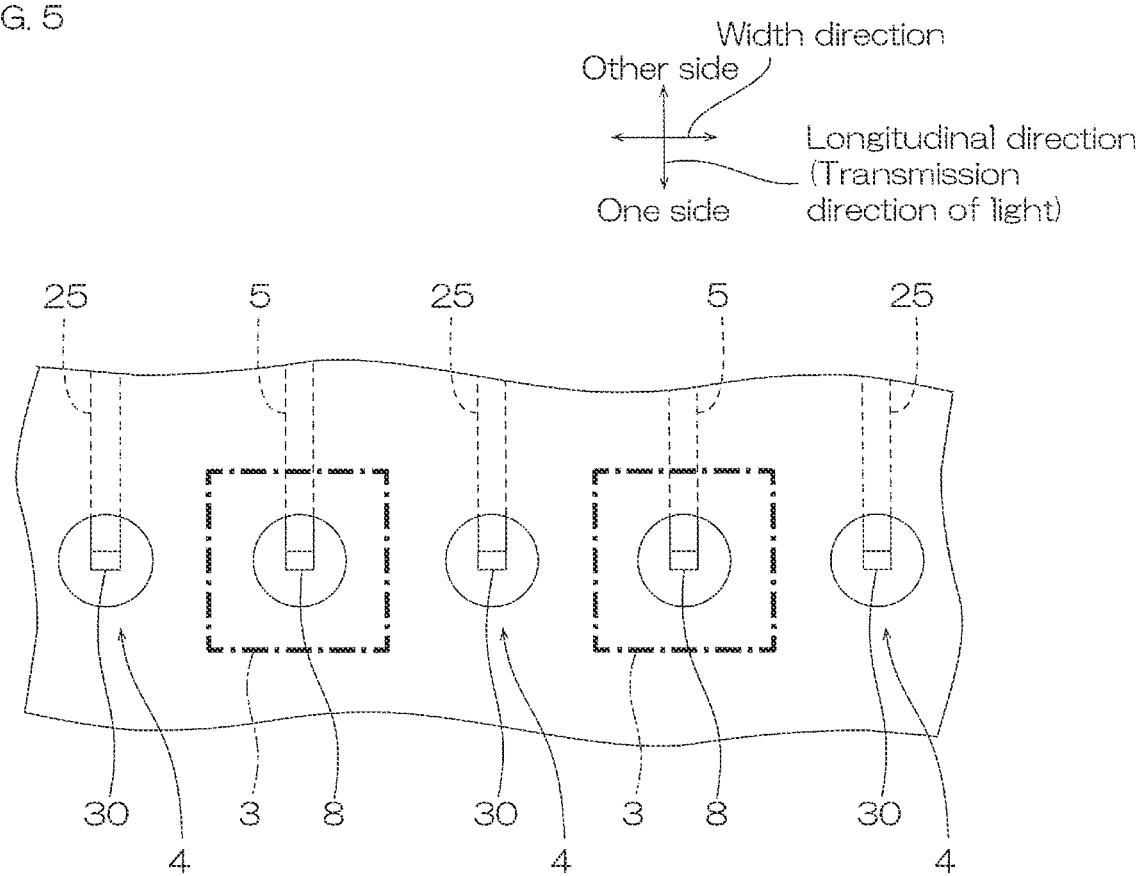
FIG. 5 shows a modified example of a mirror of the optical element device shown in FIG. 1, and an embodiment in which one mirror is disposed in one mounting region.

As shown in FIG. 1, in one embodiment, the plurality of mirrors 8 are disposed in the one mounting region 3. Alternatively, for example, as show in in FIG. 5, the one mirror 8 may be disposed in the one mounting region 3.

Figure 6A:
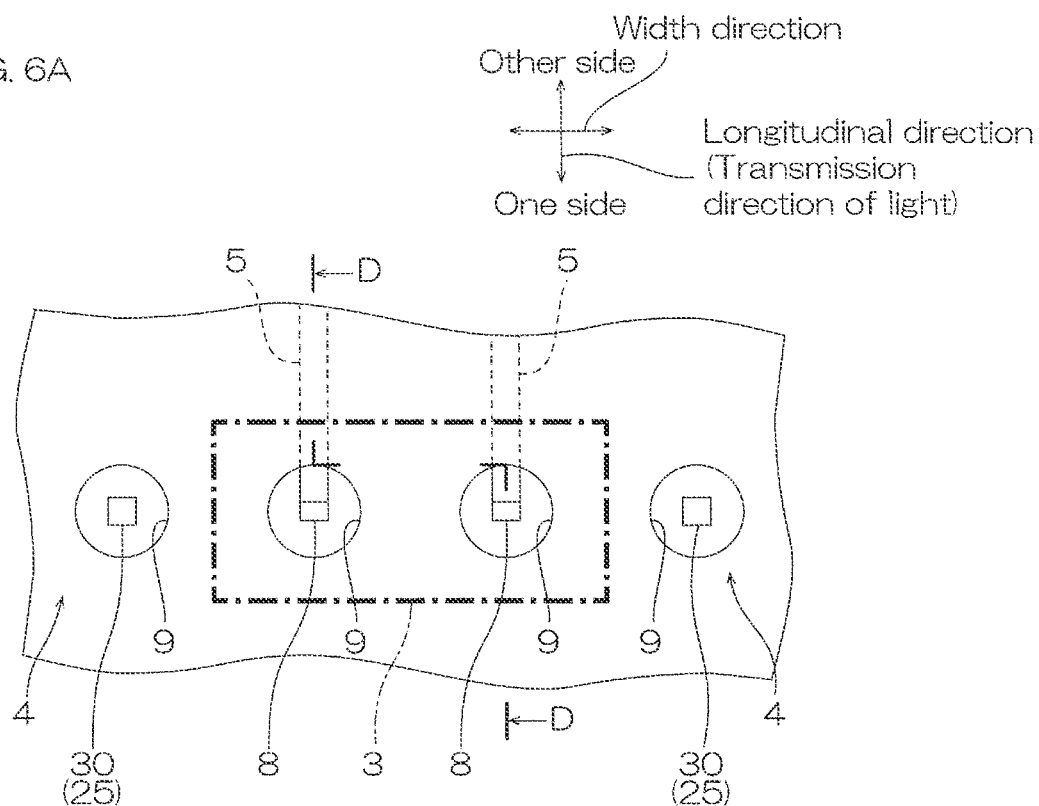
FIGS. 6A to 6B show a modified example of an alignment mark of the optical element device shown in FIG. 1, and an embodiment in which the alignment mark is only a dummy core.
Figure 6B:
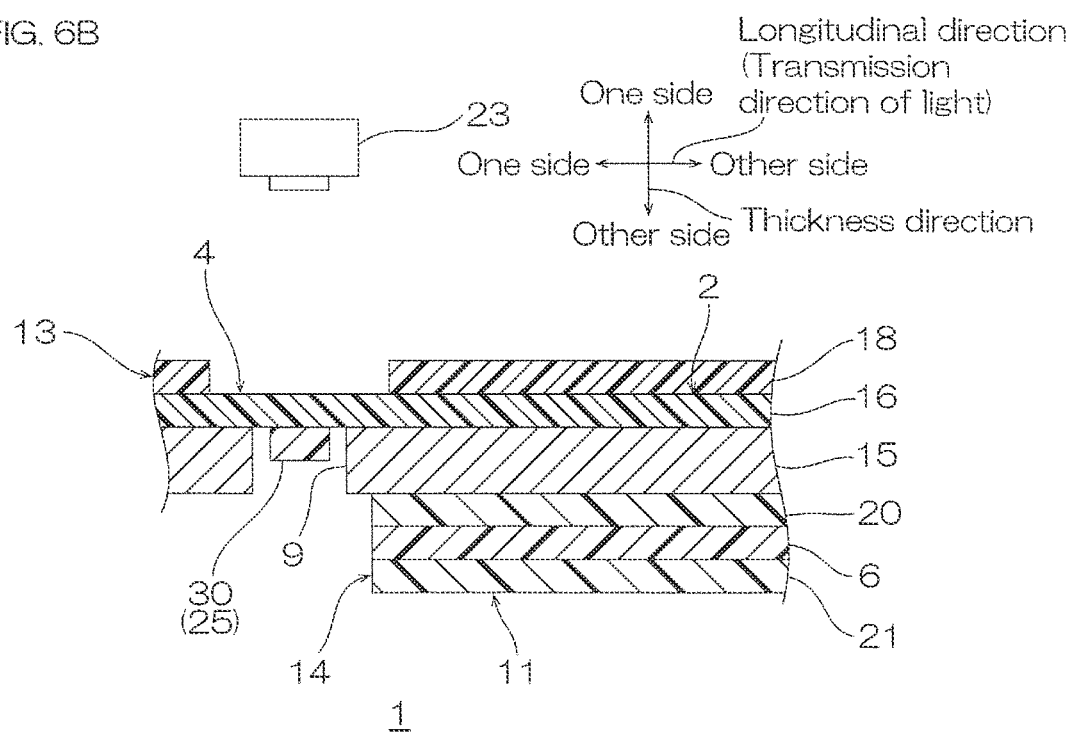

As shown in FIGS. 1 and 2B, in one embodiment, one example of the alignment mark 30 is the dummy mirror 10. However, for example, as shown in FIGS. 6A to 6B, as another example of the alignment mark 30, only the dummy core 25 can be also used.

The entire dummy core 25 is included in the opening portion 9 in the thickness direction, and the dummy core 25 has a generally rectangular shape when viewed from the top. Specifically, the dummy core 25 is independent of the optical waveguide 14 including the core 6 (isolated from the optical waveguide 14) when viewed from the top, and is disposed in an inland-shape in the opening portion 9. The dummy core 25 is disposed on the other surface in the thickness direction of the base insulating layer 16 exposed from the opening portion 9. The peripheral side surface of the dummy core 25 is spaced apart from the inner-side surface of the opening portion 9.

However, the dummy core 25 is formed from the same material as the core 6 (optical waveguide material including a core material). The dummy core 25 and the core 6 can be formed at the same time or at different times, and are preferably formed at the same time.

In the second step, the optical element 12 (ref FIG. 2A) is mounted in the mounting region 3, while the dummy core 25 is visually recognized with the camera 23.

Then, the optical element device 1 detects the dummy core 25, and it is possible to easily align the optical element 12 in the mirror 8 based on the detection.

Although not shown, as the alignment mark 30, it is also possible to provide both the dummy core 25 shown in FIGS. 6A and 6B, and the dummy mirror 10 shown in FIG. 1.

In one embodiment, the light emitting element is used as the optical element 12. Alternatively, as the optical element 12, a light receiving element such as a photodiode (PD), and a transimpedance amplifier (TIA) may be also used.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICATION

The optical element device of the present invention is used for various optical applications.

DESCRIPTION OF REFERENCE NUMBER

1 Optical element device
3 Mounting region
7 Terminal
8 Mirror
10 Dummy mirror
11 Opto-electric hybrid board 12 Optical element
13 Electric circuit board
14 Optical waveguide
25 Dummy core
30 Alignment mark

The invention claimed is:

1. An optical element device comprising:
an opto-electric hybrid board sequentially including an optical waveguide having a mirror, and an electric circuit board having a terminal in a thickness direction, and
an optical element optically connected to the mirror and electrically connected to the terminal, wherein
the opto-electric hybrid board includes:
a plurality of mounting regions including the mirror and the terminal when projected in the thickness direction and mounted with the optical element, and further includes:
a plurality of alignment marks for aligning the optical element with respect to the mirror, made of a material for forming the optical waveguide, and disposed at both outer sides of the mounting region in a width direction perpendicular to a transmission direction of light of the optical waveguide and the thickness direction,
wherein the plurality of mounting regions is disposed at spaced intervals in the width direction, and
wherein the plurality of alignment marks is disposed at both outer sides of the plurality of mounting regions in the width direction.

2. The optical element device according to claim 1, wherein the plurality of alignment marks is overlapped with the mirror or is close to the mirror when projected in the width direction.

3. The optical element device according to claim 1, wherein
a length L1 of a first line segment connecting the respective centers of the mirror and the plurality of alignment marks closest to the mirror is 10 µm or more, and
a length L2 of a second line segment connecting respective centers of the plurality of alignment marks is 30 µm or more.

4. The optical element device according to claim 1, wherein the plurality of alignment marks is directly visible from the thickness direction.

5. The optical element device according to claim 1, wherein the mirror is a plurality of mirrors disposed at spaced intervals in the width direction.

6. The optical element device according to claim 1, wherein the plurality of alignment marks includes a dummy mirror.

7. The optical element device according to claim 1, wherein the plurality of alignment marks includes a dummy core.

8. A method for producing an optical element device comprising:
a first step of preparing an opto-electric hybrid board sequentially including an optical waveguide having a mirror and an electric circuit board having a terminal in a thickness direction, including a plurality of mounting regions including the terminal and the mirror when projected in the thickness direction, and furthermore, including a plurality of alignment marks made of a material for forming the optical waveguide and disposed at both outer sides of the plurality of mounting regions in a width direction perpendicular to a transmission direction of light of the optical waveguide and the thickness direction, and
a second step of aligning an optical element with respect to the mirror based on the plurality of alignment marks to be optically connected to the mirror and to be electrically connected to the terminal, and mounting the optical element on the opto-electric hybrid board,
wherein in the second step, the optical element is mounted in the plurality of mounting regions so as not to be overlapped with the plurality of alignment marks when projected in the thickness direction,
wherein the plurality of mounting regions is disposed at spaced intervals in the width direction, and
wherein the plurality of alignment marks is disposed at both outer sides of the plurality of mounting regions in the width direction.

* * * * *